| United States Patent [19] | [11] Patent Number: 4,903,235 |
| --- | --- |
| Kubota et al. | [45] Date of Patent: Feb. 20, 1990 |

[54] SEMICONDUCTOR MEMORY

[75] Inventors: Taei Kubota; Tetsuo Nakano, both of Ohme, Japan

[73] Assignee: Hitachi, Ltd., Tokyo, Japan

[21] Appl. No.: 349,419

[22] Filed: May 9, 1989

Related U.S. Application Data

[63] Continuation of Ser. No. 74,852, Jul. 17, 1987, Pat. No. 4,831,593.

[30] Foreign Application Priority Data

Jul. 18, 1986 [JP] Japan .................................. 61-167941

[51] Int. Cl.⁴ ............................................... G11C 7/00
[52] U.S. Cl. ..................................... 365/104; 365/203; 365/205
[58] Field of Search .............. 365/104, 189.11, 189.07, 365/189.09, 203, 205, 207

[56] References Cited

U.S. PATENT DOCUMENTS 4,435,793  3/1984  Oehii ................................ 365/233
4,586,166  4/1986  Shah ............................... 365/207 X
4,831,593  5/1989  Kubota et al. ..................... 365/203

Primary Examiner—Joseph A. Popek
Attorney, Agent, or Firm—Antonelli, Terry & Wands

[57] ABSTRACT

A semiconductor memory includes an array of memory cells wherein each memory cell is disposed at the intersection between a word line and a data line. An output line of the memory is coupled to the data line via transfer MOSFET and a data line signal detecting circuit, the latter being provided between the common data line and the output line. A precharging circuit for precharging the data line and a feedback circuit for coupling together the output and input sides of the data line signal detecting circuit are provided.

5 Claims, 5 Drawing Sheets

SEMICONDUCTOR MEMORY

This is a continuation of application Ser. No. 074,852, filed July 17, 1987, now U.S. Pat. 4,831,593.

BACKGROUND OF THE INVENTION

The present invention relates to a semiconductor memory and, more particularly, to a technique which may effectively be applied to, for example, a micro-programmable ROM (Read-Only Memory) which may be incorporated in a digital processing device that adopts the microprogram system.

Digital processing devices that adopt the micro-program system are described, for example, in "Micro-programming and Its Application", Sangyo Shuppan Kabushiki Kaisha, May 20, 1974, pp. 48 to 51.

SUMMARY OF THE INVENTION

FIG. 4 shows a read circuit in a micro-programmable ROM which has been developed by the inventors of this application prior to the present invention, and FIG. 5 is a timing chart showing the read operation of the circuit shown in FIG. 4. Referring to these figures, memory cells Q11, Q16... of a ROM which are respectively constituted by N-channel MOSFETs are connected to a common data line CD1 through a data line D1 by the operation of the switching MOSFET (also serving as a capacitance cut-off MOSFET) Q5 which is supplied with a signal Y1. A relatively small parasitic capacitance Cc and a relatively large parasitic capacitance Cd are equivalently coupled to the common data line CD1 and the data line D1, respectively. These parasitic capacitances are precharged with a power supply voltage Vcc through a precharge MOSFET Q1 which is supplied with a signal $\bar{\phi}1$ formed by inverting a timing signal $\phi1$. The potential of the common data line CD1 after precharge is at a high level which is substantially equal to the power supply voltage Vcc, whereas the potential of the data line D1 is at a level which is substantially equal to Vcc-Vth, that is, the potential is lower than the power supply voltage Vcc by an amount which is substantially equal to the threshold voltage Vth of the switching MOSFET Q5.

The precharge levels of the common data line CD1 and the data line D1 are discharged by the fact that the corresponding memory cells in the ROM are turned ON in response to a word line select signal W1 which is formed in synchronism with the timing signal $\bar{\phi}1$. More specifically, each memory cell in the ROM is determined to have storage data, either the logic "1" or "0", by connecting, for example, its drain to the corresponding data line or not according to the user's specification. Accordingly, when the drain of a corresponding memory cell is connected to the data line, that is, when the data line is provided with a drain contact for the memory cell, this memory cell is turned ON in response to the word line select signal, and the common data line CD1 and the data line D1 are thus discharged. In consequence, in the case where the resistance of the discharge path is relatively small, the levels of the common data line CD1 and the data line D1 quickly shift to a low level such as a ground potential of the circuit as shown by the chain lines in FIG. 5. On the other hand, when the data line is provided with no drain contact for the corresponding memory cell, no discharge circuit is formed by the memory cell, so that the levels of the common data lines CD1 and the data line D1 are left at a high level such as Vcc or Vcc-Vth.

The potential of the common data line CD1 is determined, in synchronism with the shift of a timing signal $\phi2$ to a high level, by a logic threshold voltage of a clocked inverter CN1 which constitutes a sense amplifier SA1. The output signal from the clocked inverter CN1 is transferred to an inverter N1 and held therein by charging or discharging its input capacitance Cn in accordance with said output signal.

As described above, the read circuit shown in FIG. 4 is arranged such that the precharge level of the data line at the time of reading is lowered by an amount corresponding to the threshold voltage of the switching MOSFET Q1 to thereby restrict the signal amplitude, and that the level of the common data line is determined by means of the charge transfer type sense amplifier SA1 constituted by the clocked inverter CN1 and the inverter N1 which are provided in close proximity to the common data line, and the sensed signal is held in the input capacitance Cn of the inverter N1 to thereby achieve a high-speed read operation.

However, the inventors of this application have found that the above-described read circuit of a micro-programmable ROM still suffers from the following problems. Namely, even though no drain contact for a selected memory cell is formed, a leakage current flows through some paths which extend through the corresponding data line and MOSFETs. Accordingly, the precharge level of the data line D1 lowers as shown in the timing chart of FIG. 5. If the precharge level of the data line gradually decreases as illustrated, since the value of the parasitic capacitance Cc of the common data line CD1 is relatively small, the level of the common data line CD1 decreases quickly, an effect which is disadvantageous and undersirable. Since the lowering in level of the common data line CD1 leads to a reduction in the noise margin with respect to the sense amplifier, malfunction may occur in a worst case situation.

It is a primary object of the present invention to provide a semiconductor memory such as a high-speed micro-programmable ROM which is improved in the read margin.

The above and other objects and novel features of the present invention will become more apparent from the following description of the preferred embodiments thereof taken in conjunction with the accompanying drawings.

A representative one of the inventions disclosed in this application will be summarized below.

In a charge transfer type sense amplifier, a transfer gate MOSFET which is turned ON at its operating timing is employed to selectively feed back the output signal to the input terminal of the associated clocked inverter.

By virtue of the above-described means, the precharge level of a common data line which has begun to decrease due to a charge or the like during an operation of reading a high level from a memory cell is pulled up to a high level through the above-described transfer gate MOSFET with the effect of increasing the operation margin of the sense amplifier.

DESCRIPTION OF THE PREFERRED EMBODIMENTS

Figure 1:
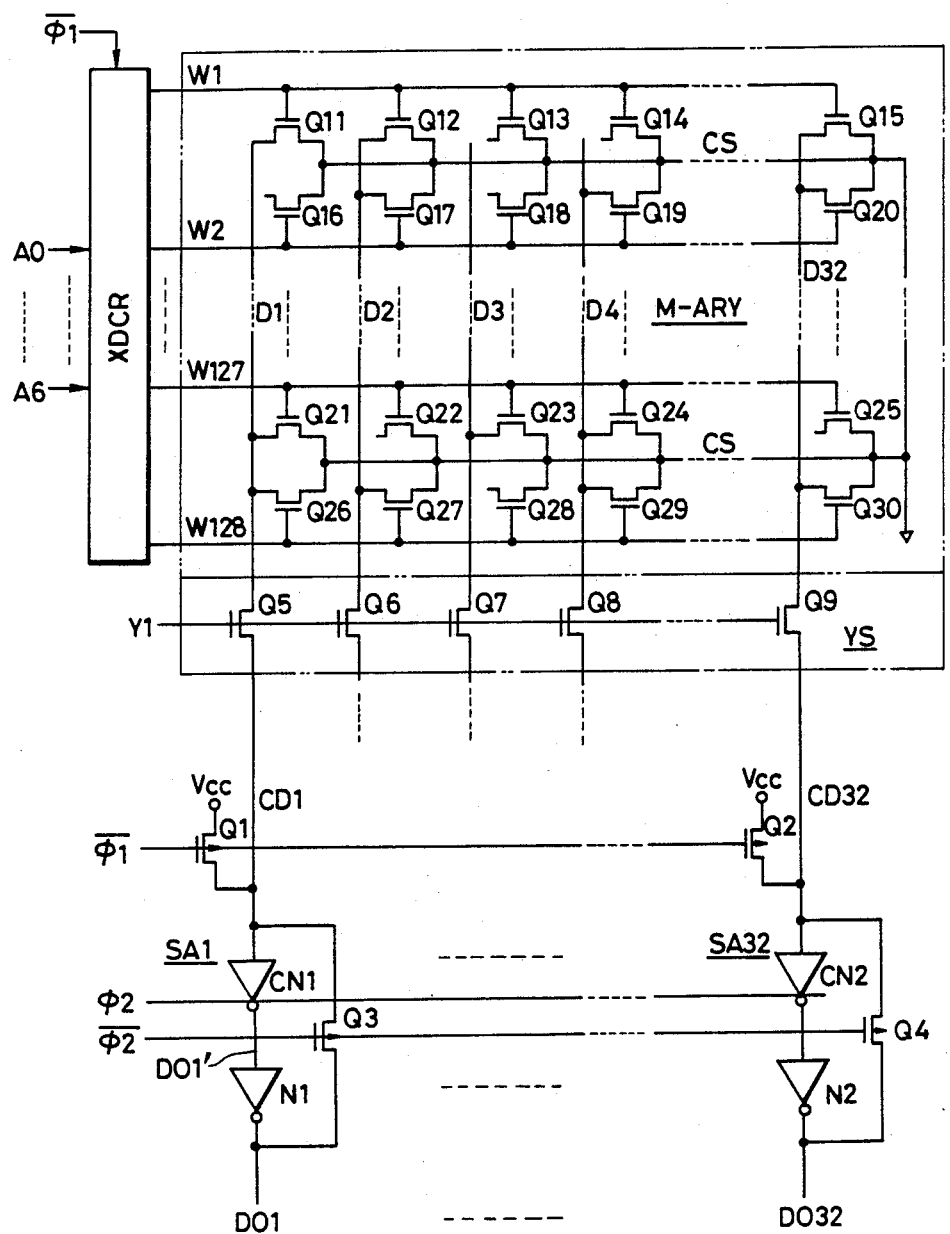
FIG. 1. is a circuit diagram of one embodiment of a micro-programmable ROM according to the present invention.

FIG. 1 is a circuit diagram of one embodiment of a micro-programmable ROM according to the present invention. Circuit elements which constitute circuit blocks shown in the figure are fabricated on a single semiconductor substrate such as single crystal silicon, however, they are not necessarily limited thereto. P- and N-channel MOSFETs are discriminated from each other by putting the arrow to the channel (back gate) of each P-channel MOSFETs.

Although not necessarily limited, the integrated circuit is fabricated on a semiconductor substrate which is defined by single crystal N-type silicon. Each of the P-channel MOSFETs is composed of source and drain regions formed on the surface of the semiconductor substrate and a gate electrode made of polycrystalline silicon which is formed on the surface of the semiconductor substrate through a thin gate insulator film so as to extend between the source and drain regions. The N-channel MOSFETs are fabricated in a P-type well region which is formed in the surface region of the semiconductor substrate. Thus, the semiconductor substrate defines a common substrate gate for a plurality of P-channel MOSFETs which are formed thereon. The P-type well region constitutes a common substrate gate for a plurality of N-channel MOSFETs which are formed thereon. The substrate gate for the N-channel MOSFETs, that is, the P-type well region, is coupled to a ground potential of the circuit shown in FIG. 1. The substrate gate for the P-channel MOSFETs, that is, the semiconductor substrate, is coupled to a power supply voltage Vcc shown in FIG. 1.

The micro-programmable ROM in accordance with this embodiment is incorporated in a microcomputer which adopts the microprogram system and is used to store a microprogram for controlling the arithmetic processing operation carried out by the microcomputer.

A memory array M-ARY consists essentially of 128 word lines W1 to W128 which are disposed so as to extend horizontally as viewed in FIG. 1, 32 data lines D1 to D32 which are disposed vertically as viewed in FIG. 1, and 128×32 memory cells Q11 to Q30 which are respectively disposed at the intersections between the word and data lines.

Each memory cell is constituted by an N-channel MOSFET and arranged to hold storage data, either the logic "1" or "0", by selectively forming a contact for its drain by means of a mask which is optionally prepared in accordance with the user's specification. More specifically, when a memory cell is formed with a contact for its drain, this memory cell is so set that it can be brought into an ON state with a predetermined threshold voltage, and is determined to hold storage data, e.g., the logic "0". When a memory cell is formed with no contact for its drain, this memory cell is not connected to a data line, and the threshold voltage thereof is set so as to be practically infinite Such a memory cell is determined to hold storage data, e.g., the logic "1". It should be noted that all the memory cells shown in FIG. 1 are connected to the corresponding data lines for reasons of convenience.

Referring to FIG. 1, the gates of memory cells Q11 to Q15, Q16 to Q20, Q21 to Q25, and Q26 to Q30 which are disposed along the same rows are coupled to the corresponding word lines W1, W2, W127 and W128, respectively. The drains of memory cells Q11, Q16, Q21, Q26 to Q15, Q20, Q25, Q30 which are disposed along the same columns are coupled to the corresponding data lines D1 to D32, respectively. The sources of all the memory cells in the memory array M-ARY are connected to a common source line CS and are supplied with the ground potential of the circuit.

The word lines constituting the memory array M-ARY are selected and specified by means of a word line select signal which is formed by an X-address decoder XDCR in synchronism with a signal $\bar{\phi}1$ which is formed by inverting a timing signal $\phi 1$.

The X-address decoder XDCR is activated in response to the inverted signal $\bar{\phi}1$ formed from the timing signal $\phi 1$ which is supplied from a control unit (not shown) fabricated within the same chip. The X-address decoder XDCR decodes address signals A0 to A6 which are supplied from an address register (not shown) and thereby selects a predetermined word line and raises the level of the selected word line to a high level such as the power supply voltage Vcc.

The 32 data lines constituting the memory array M-ARY are selectively connected to corresponding common data lines CD1 to CD32 through corresponding switching MOSFETs in a Y switch YS. More specifically, in the case, for example, of the data line D1 which is representatively shown in FIG. 1, this data line D1 is coupled to the source of the switching MOSFET Q5 in the Y switch YS. The switching MOSFETs Q5 to Q9 are brought into an ON state in response to the shift of a common signal Y1 to a high level to connect the corresponding data and common data lines to each other. The switching MOSFETs Q5 to Q9 not only perform the above-described Y gate function but also serve as MOSFETs for cutting off the capacitances between the data ( or first data) and common data (or second data) lines.

The common data lines CD1 to CD32 are connected to the input terminals of clocked inverters CN1, CN2 which constitute charge transfer type sense amplifiers SA1 to SA32, respectively. P-channel type precharge MOSFETs Q1, Q2 which are supplied at their gates with the inverted signal $\bar{\phi}1$ formed from the timing signal $\phi 1$ are respectively provided between the common data lines and the power supply voltage Vcc. These precharge MOSFETs are brought into an ON state in response to the shift of the timing signal $\phi 1$ to a low level in order to precharge the corresponding common data lines and the data lines which are selectively connected thereto.

The micro-programmable ROM in accordance with this embodiment features the arrangement of the sense amplifiers SA1 to SA32. More specifically, the sense amplifiers SA1 to SA32 are basically charge transfer type sense amplifiers each consisting of a clocked inverter CN1 (CN2) and an inverter N1 (N2) which are connected in series, i.e. cascade connected. However, the output signal from the inverter N1 (N2) is fed back to the input terminal of the clocked inverter CN1 (CN2) through a P-channel MOSFET Q3 (Q4) which constitutes a feedback circuit. Thus, in a sensing operation for determining the level of each common data line which is carried out in synchronism with a timing signal $\phi 2$ after precharging has been completed, it is possible to correct a lowering or a decrease in the high level of the corresponding data line due to a charge leakage or the like, and it is therefore possible to improve the read margin in a high-level read operation of the micro-programmable ROM. Since these feedback MOSFETs Q3, Q4 are designed so as to have a relatively small conductance, there is no fear of the high-speed performance of the charge transfer type sense amplifiers being deteriorated.

Figure 3:
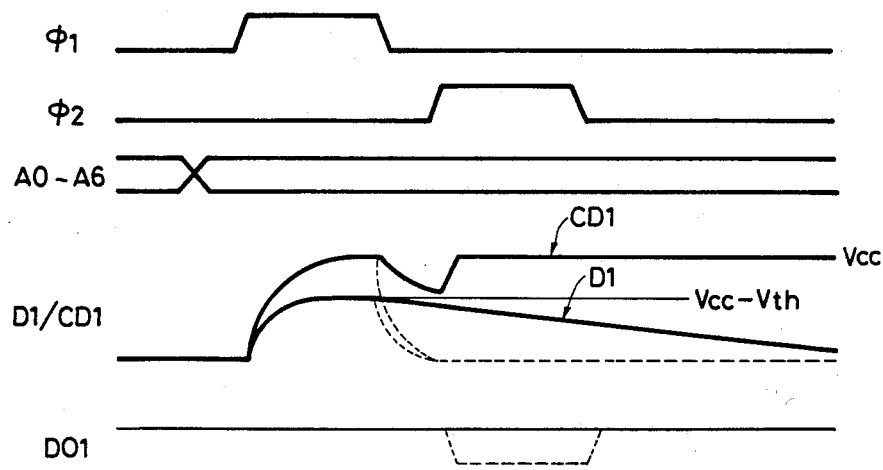
FIG. 3 is a timing chart showing the read operation of the micro-programmable ROM shown in FIGS. 1 and 2.
Figure 4:
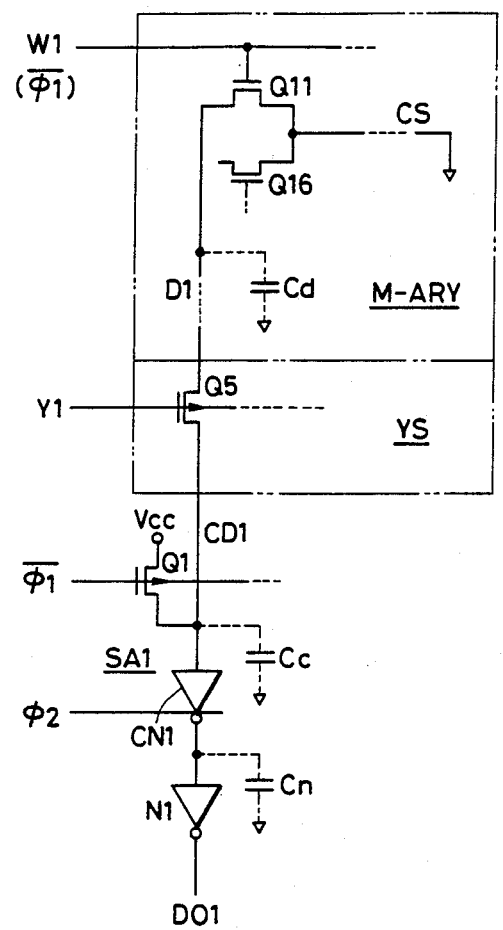
FIG. 4 is a circuit diagram of a read circuit in a micro-programmable ROM developed by the inventors of this application prior to the present invention.
Figure 5:
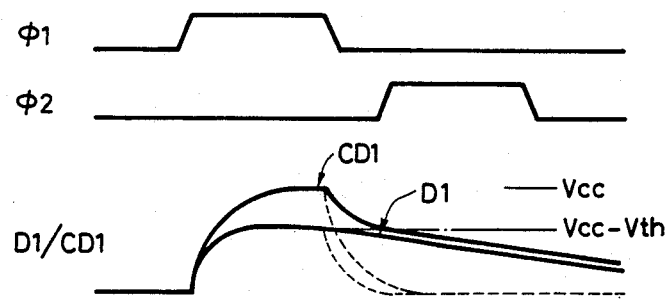
FIG. 5 is a timing chart showing the read operation of the micro-programmable ROM shown in FIG. 4.

FIG. 3 is a timing chart showing the read operation of the micro-programmable ROM shown in FIG. 1. The outline of the read operation of the micro-programmable ROM according to the present invention will be explained below with reference to FIG. 3.

As described above, the operation of the micro-programmable ROM in accordance with this embodiment is carried out in synchronism with the timing signals $\phi 1$ and $\phi 2$ which are supplied from a control unit (not shown) which is fabricated on the same chip. More specifically, the rise of the timing or phase signal $\phi 1$ is defined as a precharge timing, while the rise of the timing phase signal $\phi 2$ is defined as a timing or phase period of operation for making a determination of the level of each common data line. Arithmetic operations and control operations which are generally executed in the microcomputer that includes this micro-programmable ROM are also carried out using these timing signals as basic clock signals therefor. FIG. 3 shows one exemplary cycle of each of the timing or phase clock signals $\phi 1$ and $\phi 2$ for the purpose of facilitating understanding of the read operation of the micro-programmable ROM.

Referring to FIG. 3, prior to the change of the timing signal $\phi 1$ to a high level, new address signals A0 to A6 are supplied from the address register. A timing generator circuit (not shown) detects the fact that the new address signals A0 to A6 have been supplied, and it raises the signal Y1 to a high level. In response to the rise of the signal Y1, the MOSFETs Q5 to Q9 in the Y switch are turned ON, and the data lines are thereby connected to the corresponding common data lines CD1 to CD32.

When the timing signal $\phi 1$ is raised to the high level, the inverted signal $\overline{\phi 1}$ is shifted to the low level, and the P-channel precharge MOSFETs Q1, Q2 are turned ON. Thus, precharge is effected through the path which consists of the power supply voltage Vcc - the precharge MOSFETs - the common data lines - the switching MOSFETs in the Y switch YS - the data lines. This precharging operation causes the potential of the common data lines CD1 to CD32 to rise quickly to a high level which is substantially equal to the power supply voltage Vcc. The potential of the selected data lines D1 to D32 is lower than that of the common data lines CD1 to CD32 by an amount corresponding to the threshold voltage Vth of the switching MOSFETs Q5 to Q9 in the Y switch YS and reaches a level which is substantially equal to Vcc-Vth.

When the timing signal $\phi 1$ returns to the low level, the inverted signal $\overline{\phi 1}$ is raised to the high level, and the precharge MOSFETs Q1, Q2 are therefore turned OFF, thus completing the precharge operation. On the other hand, a word line select signal is formed in synchronism with the fall of the timing signal $\phi 1$, and a word line which is specified by the address signals A0 to A6 is raised to a high level. For example, when the word line W1 is specified, if there is formed a contact for the drain of a memory cell which is coupled thereto, the N-channel MOSFET which constitutes this memory cell is turned ON, and the high level of the corresponding data line which has been precharged is drawn to the ground of the circuit; therefore, the potential of the data line quickly changes to the low level as shown by the chain line in FIG. 3. If there is formed no contact for the drain of a memory cell which is coupled thereto, no precharge path is formed through this memory cell. Accordingly, the corresponding data line is supposed to maintain the high level attained by the precharge operation. However, since there is a leakage path which consists of the corresponding data line, MOSFETs and the like, the level of the data line gradually decreases as shown by the solid line in FIG. 3. The lowering in level of the data line causes the high level of the corresponding common data line to or decrease quickly in accordance with the potential of the data line as shown in FIG. 3.

When the timing signal $\phi 2$ is raised to the high level a little after the fall of the timing signal $\phi 1$, the clocked inverters CN1, CN2 which constitute the sense amplifiers are activated, and the sensing or reading operation of the level of the common data lines is thus started. At the same time, the P-channel type feedback MOSFETs Q3, Q4 are turned ON in response to the fall of the inverted signal $\overline{\phi 2}$ formed from the timing signal $\overline{\phi 2}$, and the output signals from the inverters N1, N2 are thereby fed back to the input terminals of the corresponding clocked inverters.

In the case where the common data line CD1 maintains a high level which is defined by the precharge level because the selected memory cell has the logic "1" as storage data, the corresponding sense amplifier latches the logic "1", that is, the sense amplifier raises the output of the inverter N1 to a high level. In consequence, the high-level output signal from the inverter N1 is fed back to the input terminal of the clocked inverter CN1 through the feedback MOSFET Q3. Accordingly, the level of the common data line CD1 which has begun to lower due to the selection of the word line is pushed up to a high level which is substantially equal to the power supply voltage Vcc as shown in FIG. 3.

Thus, the read operation of the micro-programmed ROM in accordance with this embodiment is improved in the signal margin in an operation of reading the high level, i.e., the logic "1", and it is therefore possible to prevent erroneous reading. Since the P-channel MOSFETs Q3, Q4 which respectively constitute feedback circuits for the sense amplifiers are designed so as to have a relatively small conductance, there is practically no adverse effect on the operation of reading the low level. Accordingly, there is no fear of the high-speed performance of the charge transfer type sense amplifiers being deteriorated. Thus, it is possible to realize a high-speed micro-programmable ROM having a large level margin.

Figure 2:
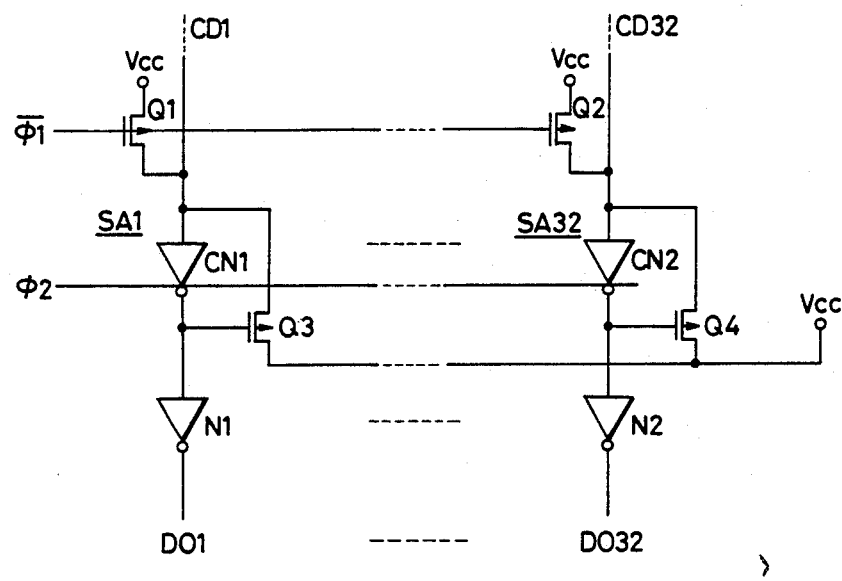
FIG. 2 is a circuit diagram of a read circuit in another embodiment of the micro-programmable ROM according to the present invention.

FIG. 2 is a circuit diagram showing another embodiment of the micro-programmable ROM according to the present invention. In this embodiment, the arrangement and operation of each of the circuit blocks other than the sense amplifiers SA1 to SA32 are the same as those in the case of the embodiment shown in FIG. 1 and description thereof is therefore omitted.

Referring to FIG. 2, each of the sense amplifiers SA1 to SA32 in the micro-programmable ROM in accordance with this embodiment is constituted by a clocked inverter CN1 (CN2) and an inverter N1 (N2) in the same way as in the embodiment shown in FIG. 1. The drains of P-channel MOSFETs Q3, Q4 which constitute feedback circuits are coupled to the input terminals of the clocked inverters constituting the sense amplifiers, respectively, and the gates of the MOSFETs Q3, Q4 are coupled to the output terminals of the clocked inverters, respectively. The sources of these MOSFETs Q3, Q4 are mutually supplied with the power supply voltage Vcc. The feedback MOSFETs Q3, Q4 are designed so as to have a relatively small conductance in the same way as in the case of the embodiment shown in FIG. 1.

During a read operation, when the timing signal φ1 returns to the low level after the data line D1 and the common data line CD1 have been precharged, a word line select operation is conducted, and the data line D1 and the common data line CD1 are started to be discharged.

When a contact for the drain of a selected memory cell is formed, that is, when data representing the logic "0" is stored in the selected memory cell, a discharge path is formed through this memory cell. Accordingly, the high levels of the data line D1 and the common data line CD attained by the precharging operation quickly lower to reach a low level which is substantially equal to the ground potential of the circuit. On the other hand, when no contact for the drain of a selected memory cell is formed, that is, when data representing the logic "1" is stored in the selected memory, no discharge path is formed through the memory cell. However, the high level of the data line is gradually lowered through a leakage path which consists of the corresponding data line, MOSFETs and the like in the same manner as in the embodiment shown in FIG. 1. The lowering of the high level of th data line D1 causes the high level of the common data line CD1 to lower.

When the timing signal φ2 is raised to a high level, the clocked inverter CN1 is activated, and a sensing operation for determining the level of the common data line CD is started. The source of the feedback MOSFET Q3 is supplied with the power supply voltage Vcc. When a selected memory cell has the logic "1" as storage data, the output signal from the clocked inverter CN1 is shifted to a low level because of the high level of the common data line CD1. Consequently, the feedback MOSFET Q3 is turned ON, and a high level is supplied to the input terminal of the clocked inverter CN1. Accordingly, the level of the common data line CD which has begun to gradually lower in an operation of reading the logic "1" is quickly restored to the high level, thereby improving the read margin. In an operation of reading the logic "0", if the data which was read previously was the logic "1", the feedback MOSFET Q3 is temporarily turned ON and held in this state until the timing signal φ2 is raised to the high level and the operative state of the clocked inverter CN1 has been established. However, since the conductance of the MOSFET Q3 is set so as to be relatively small, the potential at the input terminal of the clocked inverter CN1, that is, the potential of the common data line CD1, is quickly changed to the low level by the discharge operation. Accordingly, the output signal from the clocked inverter CN is raised to a high level, thus causing the feedback MOSFET Q3 to be turned OFF so as to suspend the feedback operation.

As described above, the feedback operation of each feedback MOSFET in the micro-programmable ROM in accordance with this embodiment can be controlled at a relatively high speed since its gate is controlled by means of the output signal from a clocked inverter which is coupled thereto. In the case of the embodiment shown in FIG. 1, if the previously read data was a low level signal, a low-level output signal from the inverter N1 is undesirably fed back to the input terminal of the clocked inverter CN1 in response to the rise of the timing signal φ2. However, in this embodiment the source of the feedback MOSFET is supplied with the power supply voltage Vcc; therefore, there is no fear of the low-level signal being fed back to the input terminal of the clocked inverter CN1, so that it is possible to ensure the operation margin of the sense amplifier independently of the previously read data.

Figure 6:
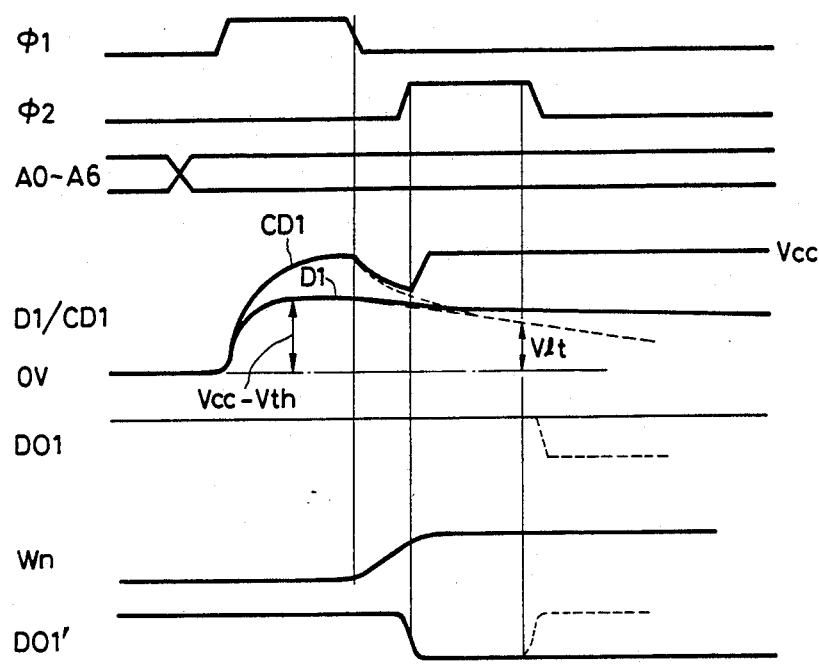
FIG. 6 is a timing chart for showing another example of the read operation of the micro-programmable ROM according to the present invention.

FIG. 6 is a timing chart showing another example of the read operation of the micro-programmable ROM shown in FIG. 1. This timing chart greatly differs from the timing chart shown in FIG. 3 in that the electric charge which is precharged in the data line D1 is discharged relatively slowly through a MOSFET which constitutes a memory cell. More specifically, the levels of the data line D1 and the common data line CD1 gradually lower from the point of time when the potential of the word line Wn rises as shown by the chain lines in FIG. 6. This phenomenon occurs in the case where the size of the memory array M-ARY is relatively large. This is because an increase in the number of memory cells causes an increase in the parasitic capacitance of data lines to which the memory cells are coupled and, in addition, an increase in the length of each data line causes a rise in resistance of the resultant discharge path.

Referring to FIG. 6, the potential of the common data line CD1 gradually lowers as shown by the chain line, and when the potential of the common data line CD1 reaches the logical threshold voltage Vlt, the output signal DO1' is inverted from a low level to a high level. As a result, the output signal DO1 from the sense amplifier SA1 is shifted to a low level as shown by the chain line in the figure. In order to secure such an operation, it is necessary to hold the timing signal φ2 in the high level state until, at least, the potential of the common data line CD1 reaches the above-described logical theoretical voltage Vlt. If the timing signal φ2 is shifted to the low level before the above-described point of time, the clocked inverter CN1 is brought into an inoperative state, so that it is impossible to detect an input signal which is to take a low level.

The present invention is greatly effective in application to a ROM which performs an operation such as that shown in FIG. 6. This is because in such a ROM the clocked inverter is held in an operative state for a relatively long period of time and, therefore, there is a strong possibility of the clocked inverter malfunctioning unless lowering in the level of the common data line due to a leakage current is not prevented.

Figure 7:
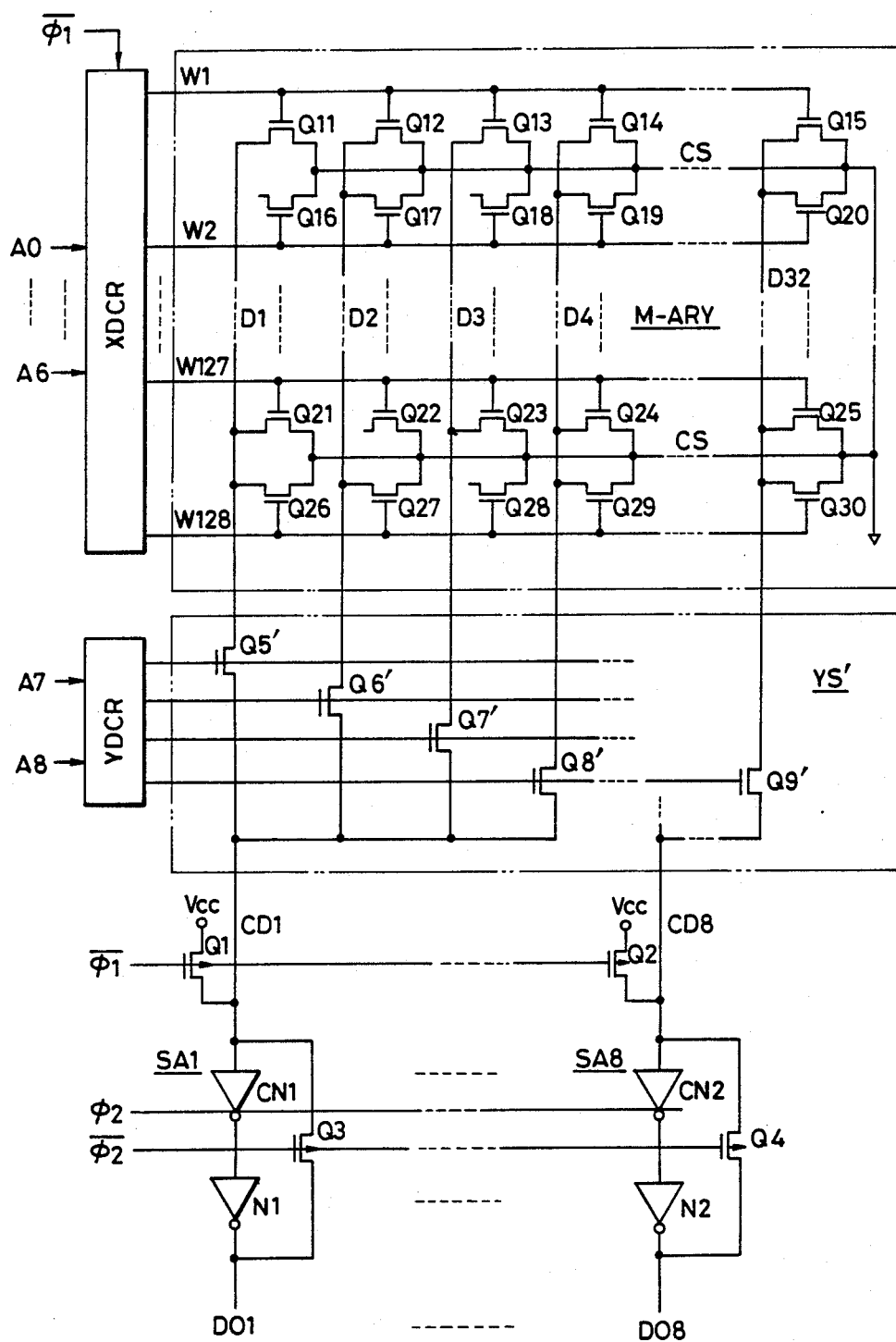
FIG. 7 is a circuit diagram of still another embodiment of the micro-programmable ROM according to the present invention.

FIG. 7 shows still another embodiment of the present invention. The basic arrangement of this embodiment is the same as that of the embodiment shown in FIG. 1, but this embodiment differs from the first embodiment in the arrangement of the Y switch. The Y switch YS' in this embodiment is composed of switching MOSFETs Q5' to Q9' which are controlled by a Y decoder YDCR. The Y decoder YDCR raises one of the four output lines to a high level on the basis of address signals A7 and A8. As a result, eight data lines selected from the data lines D1 to D32 are coupled to common data lines CD1 to CD8, respectively. In this embodiment, eight sense amplifiers SA1 to SA8 are provided in correspondence with the common data lines CD1 to CD8, respectively. In this embodiment, MOSFETs Q5' to Q9' for shifting the precharge level can also be operated as column switches which are controlled by the Y decoder YDCR.

It should be noted that, when, in this embodiment, the data lines D1 to D32 are precharged, all the MOSFETs Q5' to Q9' are turned ON.

Figure 8:
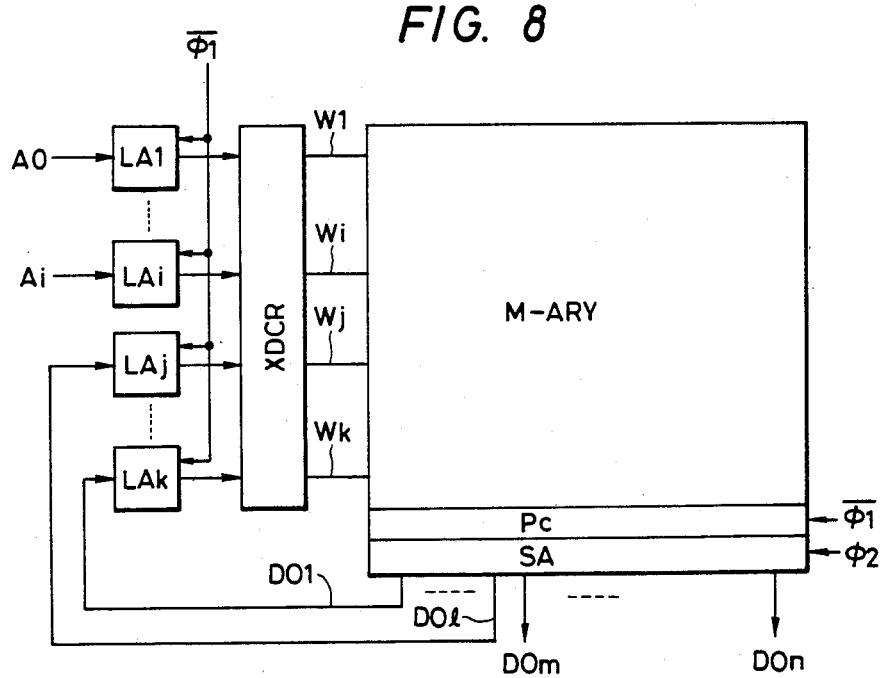
FIG. 8 is a block diagram showing a further embodiment of the micro-programmable ROM according to the present invention.

FIG. 8 shows a further embodiment of the microprogrammable ROM according to the present invention. In this embodiment, there are provided latches LA1 to LAi and LAj to LAk for temporarily holding address signals which are supplied to the X decoder XDCR. The latches LA1 to LAi are arranged to latch address signals A0 to Ai which are supplied from the outside of this micro-programmable ROM. The latches LAj to LAk are arranged to latch a part D01 to D0L of the output signal from the micro-programmable ROM. Thus, a part of the output signal is employed as a part of the input address signal, and this enables a series of related micro instructions to be successively read out from the micro-programmable ROM. The address signals which are latched in the latches LA1 to LAi and LAj to LAk are supplied to the X decoder XDCR in synchronism with the rise of the timing signal $\overline{\phi 1}$. The X decoder XDCR selectively raises any one of the word lines W1 to Wk to a predetermined voltage level on the basis of the input address signals. The memory array M-ARY, the precharge circuit PC and the sense amplifier SA are, for example, arranged as shown in FIG. 1. Accordingly, the period during which the timing signal $\overline{\phi 1}$ is at the low level is defined as a precharge period for precharging the data lines D1 to D32 in the memory array M-ARY, and discharge of a selected data line is started in synchronism with the fall of the timing signal $\overline{\phi 1}$. At the same time, the non-selected data lines are also undesirably discharged due to a leakage current. In order to overcome this problem, this embodiment secures the undesirable discharge of the data lines in synchronism with the rise of the timing signal $\phi 2$ as shown in FIG. 3. Thereafter, the output signals D01 to D0n are decided in response to the fall of the timing signal $\phi 2$. When the timing signal $\overline{\phi 1}$ rises thereafter, a precharge operation for a subsequent read operation is started.

According to the embodiments of the present invention, it is possible to ensure that the undesirable discharge of the data lines will take place after the precharge operation has been completed. Therefore, it is possible to make the precharge period relatively short. This is because, in the case where it is impossible to ensure that the undesirable discharge of the data lines will take place after the precharge operation, it is necessary to provide a relatively long precharge period in order to precharge all the data lines to a sufficiently high voltage.

The read cycle of the micro-programmable ROM shown in FIG. 8 is determined by the period which begins at the time the timing signal $\overline{\phi 1}$ falls and which ends at the time the signal $\overline{\phi 1}$ falls subsequently. Accordingly, if the present invention is applied to the micro-programmable ROM, the read cycle of the ROM can be shortened by virtue of the advantage that the precharge period is relatively short. One machine cycle of a data processing device which incorporates a micro-programmable ROM is substantially determined by the read cycle of the ROM. Accordingly, application of the present invention to a micro-programmable ROM enables a reduction in the machine cycle of a data processing device which incorporates such a ROM. Thus, it is possible to provide a data processing device which is capable of operating at high speed, for example, a microprocessor, microcomputer, etc.

As has been described above, when the present invention is applied to a semiconductor memory such as a micro-programmable ROM which is employed in, for example, a microcomputer, the following advantages are provided:

(1) A charge transfer type sense amplifier which is employed in a micro-programmable ROM is provided with a feedback circuit which is adapted for selectively feeding back a high-level output signal to tee input terminal of a clocked inverter which constitutes the sense amplifier at the operating timing of the sense amplifier. Thus, it is possible to correct the level of the corresponding common data line which has begun to lower or discharge due to a leakage or the like during an operation of reading a high-level signal from a selected memory cell, and this enables an improvement in the operation margin of the micro-programmable ROM at the time of reading a high-level signal.

(2) Since the above-described feedback circuit is constituted by a MOSFET which is designed so as to have a relatively small conductance, there is no fear of the high-speed performance of the charge transfer type sense amplifier being deteriorated. Accordingly, it is possible to realize a high-speed micro-programmable ROM which is improved in the read margin.

Although the invention accomplished by the present inventors has been exemplified by way of illustrated embodiments, it should be noted here that the present invention is not to be construed as being necessarily limited to the described embodiments and that various changes and modifications may be imparted thereto without departing from the spirit and scope of the invention. For example, although in the embodiments memory cells are constituted by N-channel MOSFETs, P-channel MOSFETs may also be employed to constitute them. In such a case, each word line needs to be at a high level when it is not selected and at a low level when it is selected. Further, the present invention may be carried out in various forms, for example, in terms of the practical circuit configuration of the feed back circuit and the combination of data line groups.

Although the invention accomplished by the present inventors has mainly be described by way of one example in which the present invention is applied to a microprogrammable ROM which may be incorporated in a microcomputer that is an applicable field of the invention on which it is based, it should be noted here that the present invention is not necessarily limited thereto and may also be applied to various kinds of semiconductor devices, for example, one which has a processor that adopts the microprogram system. The present invention may be applied to any micro-programmable ROM that employs, at least, a charge transfer type sense amplifier and to any semiconductor device that includes such a ROM.

What is claimed is:

1. A semiconductor memory comprising:
   a word line;
   a plurality of data lines;
   a plurality of memory cells each of which is disposed at an intersection between said word line and one of said data lines;
   a common data line;
   a plurality of first MOSFETs each of which has a first conductivity type and is coupled between one of said data lines and said common data line;
   selecting means coupled to said first MOSFETs and including means for controlling the operation of each of said first MOSFETs;
   amplifier means coupled to said common data line and including means for providing an output signal having an inverted level with respect to an signal on said common data line; and
   a second MOSFET having a second conductivity type, coupled to said common data line and responsive to said output signal for providing a predetermined voltage level to said common data line.

2. A semiconductor memory according to claim 1, further comprising:
   precharge means for precharging each of said data lines at predetermined level.

3. A semiconductor memory comprising:
   a word line;
   a plurality of data lines;
   a reference line;
   a plurality of memory cells each of which is disposed at an intersection between said word line and one of said data lines, wherein at least one memory cell includes a first MOSFET having a gate electrode coupled to said word line, a first electrode coupled to a corresponding data line and a second electrode coupled to said reference line;
   a common data line;
   a plurality of second MOSFETs each of which has a first conductivity type and is coupled between each of said data lines and said common data line;
   selecting means coupled to said second MOSFETs and including means for controlling the operation of each of said second MOSFETs;
   amplifier means coupled to said common data line and including means for providing an output signal which has an inverted level with respect to a signal on said common data line; and
   a third MOSFET having a second conductivity type, coupled to said common data line and responsive to said output signal for providing a predetermined voltage level to said common data line.

4. A semiconductor memory according to claim 3, further comprising:
   precharge means for precharging each of said data lines at a predetermined level.

5. A semiconductor memory according to claim 4, wherein said first MOSFET has said first conductivity type.

* * * * *